(12) United States Patent
Zhu et al.

(10) Patent No.: US 9,356,025 B2
(45) Date of Patent: May 31, 2016

(54) ENHANCING MOSFET PERFORMANCE WITH CORNER STRESSES OF STI

(75) Inventors: Huilong Zhu, Poughkeepsie, NY (US); Zhijiong Luo, Poughkeepsie, NY (US); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 26 days.

(21) Appl. No.: 14/348,579

(22) PCT Filed: Mar. 29, 2012

(86) PCT No.: PCT/CN2012/000403
§ 371 (c)(1),
(2), (4) Date: Mar. 28, 2014

(87) PCT Pub. No.: WO2013/086764
PCT Pub. Date: Jun. 20, 2013

(65) Prior Publication Data
US 2014/0225200 A1    Aug. 14, 2014

(30) Foreign Application Priority Data

Dec. 14, 2011    (CN) .......................... 2011 1 0417139

(51) Int. Cl.
*H01L 27/092* (2006.01)
*H01L 29/78* (2006.01)
(Continued)

(52) U.S. Cl.
CPC ........ *H01L 27/092* (2013.01); *H01L 21/76224* (2013.01); *H01L 21/823807* (2013.01); *H01L 21/823878* (2013.01); *H01L 29/66575* (2013.01); *H01L 29/7846* (2013.01)

(58) Field of Classification Search
CPC ............ H01L 27/092; H01L 29/66575; H01L 21/76224; H01L 21/823807; H01L 21/823878; H01L 29/7846
See application file for complete search history.

(56) References Cited

U.S. PATENT DOCUMENTS

| 7,320,926 | B2 | 1/2008 | Chi .............................. 438/435 |
| 7,759,739 | B2 | 7/2010 | Chidambarrao et al. ..... 257/368 |

(Continued)

FOREIGN PATENT DOCUMENTS

| CN | 1956221 A | 5/2007 |
| CN | 101341591 A | 1/2009 |

(Continued)

*Primary Examiner* — Jarrett Stark
(74) *Attorney, Agent, or Firm* — Martine Penilla Group, LLP (57) ABSTRACT

The present invention relates to enhancing MOSFET performance with the corner stresses of STI. A method of manufacturing a MOS device comprises the steps of: providing a semiconductor substrate; forming trenches on the semiconductor substrate and at least a pMOS region and at least an nMOS region surrounded by the trenches; filling the trenches with a dielectric material having a stress; removing at least the dielectric material having a stress in the trenches which is adjacent to a position where a channel is to be formed on each of the pMOS and nMOS regions so as to form exposed regions; filling the exposed regions with a insulating material; and forming pMOS and nMOS devices on the pMOS region and the nMOS region, respectively, wherein each of the pMOS and nMOS devices comprises a channel, a gate formed above the channel, and a source and a drain formed at both sides of the channel; wherein in a channel length direction, the boundary of each exposed region is substantially aligned with the boundary of the position of the channel, or the boundary of each exposed region extends along the channel length direction to be aligned with the boundary of corresponding pMOS or nMOS region.

16 Claims, 11 Drawing Sheets

(51) Int. Cl.
*H01L 21/8238* (2006.01)
*H01L 21/762* (2006.01)
*H01L 29/66* (2006.01)

(56) References Cited

U.S. PATENT DOCUMENTS 7,834,414 B2   11/2010   Suzuki et al. ............... 257/506
2007/0096215 A1   5/2007   Chidambarrao et al. ..... 257/368
2008/0237725 A1   10/2008   Suzuki et al. ............... 257/368

FOREIGN PATENT DOCUMENTS

| | | | |
|---|---|---|---|
| CN | 102097378 A | 6/2011 | ............ H01L 21/336 |
| CN | 102214657 A | 10/2011 | ............ H01L 27/088 |
| KR | 20090036319 A | 4/2009 | ............ H01L 21/336 |
| TW | 201112334 A | 4/2011 | ............ H01L 21/336 |

Fig. 19b

ENHANCING MOSFET PERFORMANCE WITH CORNER STRESSES OF STI

CLAIM OF PRIORITY

This application is a National Phase application of, and claims priority to, PCT Application PCT/CN2012/000403, filed on Mar. 29, 2012, entitled "Enhancing MOSFET performance with corner stresses of STI", which claimed priority to Chinese Application No. 201110417139.2, filed on Dec. 14, 2011. Both the PCT Application and Chinese Application are incorporated herein by reference in their entireties.

FIELD OF THE INVENTION

The present invention relates to the technical field of semiconductor manufacturing and, more particularly, to a structure and a method for enhancing MOSFET performance with corner stresses of a Shallow Trench Isolation (STI).

BACKGROUND OF THE INVENTION

It has been proved by both theoretical research and experience investigation that when a stress is applied to a channel of a transistor, the carrier mobility of the transistor will be increased or decreased. However, it is also known that electrons and holes have different responses to strains of the same type. For example, applying a compressive stress in the direction of current flow is favorable to the hole mobility but harmful to the electron mobility, while applying a tensile stress is favorable to the electron mobility but harmful to the hole mobility. To be specific, with respect to an nMOS device, applying a tensile stress along the direction of the channel will increase mobility of electrons in the channel; on the other hand, with respect to a pMOS device, applying a compressive stress along the direction of the channel will increase mobility of holes in the channel. With the continuous reduction in the feature size of the device, the strained channel engineering for the purpose of increasing mobility of carriers in the channel is playing a more and more important role. However, smaller device pitch will result in more difficulties in applying strong stresses to the MOSFET.

Therefore, there is still need for a new structure and a method that can easily increase the stress in the channel.

SUMMARY OF THE INVENTION

To solve the above problem, according to one aspect of the present invention, a method of manufacturing a MOS device is provided, which comprises the steps of: providing a semiconductor substrate; forming trenches on the semiconductor substrate and at least a pMOS region and at least an nMOS region surrounded by the trenches; filling the trenches with a dielectric material having a stress; removing at least the dielectric material having a stress in the trenches which is adjacent to a position where a channel is to be formed on each of the pMOS and nMOS regions so as to form exposed regions; filling the exposed regions with a insulating material; and forming pMOS and nMOS devices on the pMOS region and the nMOS region, respectively, wherein each of the pMOS and nMOS devices comprises a channel, a gate formed above the channel, and a source and a drain formed at both sides of the channel; wherein in a channel length direction, the boundary of each exposed region is substantially aligned with the boundary of the position of the channel, or the boundary of each exposed region extends along the channel length direction to be aligned with the boundary of corresponding pMOS or nMOS region.

According to one aspect of the present invention, a MOS device is provided, comprising: a semiconductor substrate; trenches formed on the semiconductor substrate, and at least a pMOS region and at least an nMOS region surrounded by the trenches; a dielectric material having a stress and filled in the trenches; exposed regions, which are obtained by removing at least the dielectric material having a stress in the trenches which are adjacent to positions where channels are to be formed on the pMOS and nMOS regions; a insulating material filled in the exposed regions; and pMOS and nMOS devices formed on the pMOS and nMOS regions, respectively, wherein each of the pMOS and nMOS devices comprises a channel, a gate formed above the channel, and a source and a drain formed at both sides of the channel; wherein in a channel length direction, the boundary of each exposed region is substantially aligned with the boundary of the position of the channel, or the boundary of each exposed region extends along the channel length direction to be aligned with the boundary of corresponding pMOS or nMOS region.

According to one aspect of the present invention, a method of manufacturing a MOS device is provided, which comprises the steps of: providing a semiconductor substrate; forming trenches on the semiconductor substrate, at least a pMOS region and at least an nMOS region surrounded by the trenches; filling the trenches with a dielectric material having a stress; removing at least the dielectric material having a stress in the trenches at outer sides of the pMOS and nMOS regions that are away from each other, so as to form exposed regions at portions where the dielectric material having a stress are removed; filling the exposed regions with a insulating material; and forming pMOS and nMOS devices on the pMOS and nMOS regions, respectively, wherein each of the pMOS and nMOS devices comprises a channel, a gate formed above the channel, and a source and a drain formed at both sides of the channel; wherein in channel length direction, boundary of each exposed region is substantially aligned with boundary of corresponding pMOS or nMOS region, or the boundary of each exposed region extends toward the direction of the channel along the channel length direction until it reaches the boundary of the position where a channel is formed.

According to one aspect of the present invention, a MOS device is also provided, comprising: a semiconductor substrate; trenches formed on the semiconductor substrate, at least a pMOS region, and at least an nMOS region surrounded by the trenches; a dielectric material having a stress and filled in the trenches; exposed regions, which are obtained by removing at least the dielectric material having a stress in the trenches at outer sides of the pMOS and nMOS regions that are away from each other; an insulating material filled in the exposed regions; and pMOS and nMOS devices formed on the pMOS and nMOS regions, respectively, wherein each of the pMOS and nMOS devices comprises a channel, a gate formed above the channel, and a source and a drain formed at both sides of the channel; wherein in channel length direction, boundary of each exposed region is substantially aligned with boundary of corresponding pMOS or nMOS region, or the boundary of each exposed region extends toward the direction of the channel along the channel length direction until it reaches boundary of a position where a channel is formed.

The dielectric material having a stress and the semiconductor substrate thereunder in the present invention have the same stress. However, the substrate has a greater thickness, and therefore the unit stress produced thereby is far less than the unit stress at the position where the dielectric material having a stress is located. When removing the dielectric material having a stress, a larger force thereon acts on the boundary of the un-removed dielectric material having a stress, thus generating a "Corner Effect". In the embodiments of the present invention, after removing the dielectric material having a stress, a larger force will be generated between the edge of the remaining dielectric material having a stress and the substrate contacting therewith, so that a larger stress will be generated in the channel of the MOSFET. As a result, it is easier to enhance the MOSFET performance.

BRIEF DESCRIPTION OF THE DRAWINGS

The embodiments can be best understood with reference to the following descriptions and the drawings illustrating each of the embodiments. In the drawings.

DETAILED DESCRIPTION OF THE PREFERRED EMBODIMENTS

One or more aspects of the embodiment of the present invention will be described below with reference to the figures, wherein throughout the figures, the same elements are generally represented by the same reference signs. In the descriptions below, many specific details are elucidated for the purpose of explanation, so that a thorough understanding of one or more aspects of the embodiment of the present invention can be provided. However, it is obvious to those skilled in the art that one or more aspects of the embodiment of the present invention may be implemented by a fewer of the specific details.

First Embodiment

First, a semiconductor substrate 100 is provided, and can be of any type known in the field of electronics, such as a bulk semiconductor, and Semiconductor On Insulator (SOI). The material of the substrate can be monocrystalline silicon, gallium arsenide, indium phosphide, etc. In one specific embodiment, the semiconductor substrate 100 is a silicon substrate with (100) crystal orientation or (110) crystal orientation. The selection of the crystal orientation depends on requirements for the performance of the finished device, and the substrate with (100) crystal orientation can help to increase mobility of electrons in the device, while the substrate with (110) crystal orientation can help to increase mobility of holes in the device, and the electron mobility is greater than the hole mobility due to their properties. Therefore, in a CMOS device, for example, if it is desired that the performance of the pMOS device therein is as close as possible to the performance of the nMOS device, then the substrate with (110) crystal orientation is preferable; and if a higher performance of the nMOS device is desired, then the substrate with (100) crystal orientation is preferable. In addition, the provided semiconductor substrate may be P-type, N-type or un-doped.

Next, the step of forming trenches and MOS regions surrounded by the trenches on the semiconductor substrate is performed.

To this end, a hard mask is first formed in an embodiment. In one specific embodiment, an oxide 105 is first formed on the semiconductor substrate 100, and includes, but is not limited to, $SiO_2$, and has a thickness within the range of about 5-20 nm, for example. The method of forming the oxide includes, but is not limited to, Chemical Vapor Deposition (CVD), Plasma Assisted CVD, Atomic Layer Deposition (ALD), vapor deposition, reactive sputtering, chemical solution deposition or other similar deposition techniques. As a substitute, the oxide may also be formed by a thermal oxidation technology or by a combination of thermal oxidation technology and deposition technology. For example, in the case where the substrate is formed of Si, thermal oxidation is performed on the silicon substrate to form a thin $SiO_2$, then the rest $SiO_2$ is deposited to reach a predetermined height using a deposition technology.

Next, a nitride 110 is formed on the oxide 105. The nitride includes, but is not limited to, SiN and $Si_3N_4$, and the thickness thereof is, for example, within a range of about 50-150 nm. The method of forming the nitride includes, but is not limited to, Chemical Vapor Deposition (CVD), Plasma Assisted CVD, Atomic Layer Deposition (ALD), vapor deposition, reactive sputtering, chemical solution deposition or other similar deposition techniques.

Figure 1A:
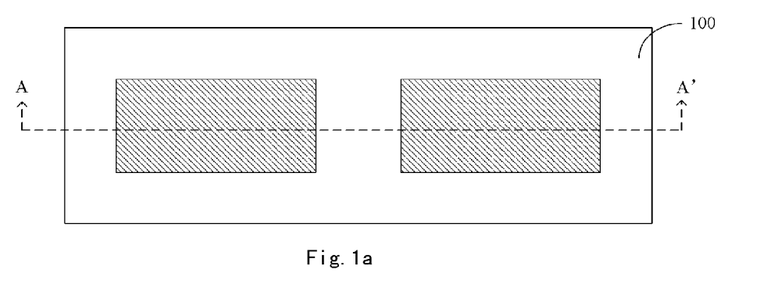
FIGS. 1a-1b, 2, 3a-3b, 4a-4d, 5a-5c, 6a-6b, 7a-7b, 8a-8b, 9, 10a-10b, 11a-11b, 12a-12b, 13, 14a-14b, 15a-15d, 16a-16c, 17a-17b, 18a-18b and 19a-19b show the sectional views of the device corresponding to each of the steps of the present invention.
Figure 1B:
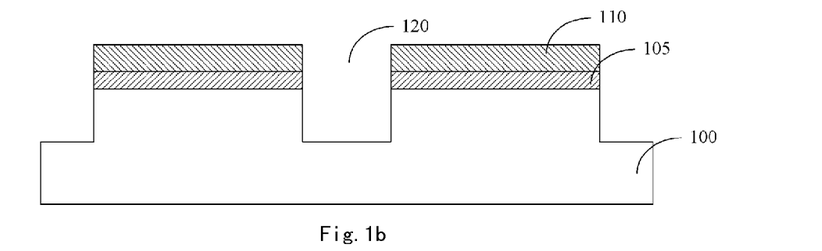

Then, the oxide and nitride are patterned to form a patterned hard mask, and parts of the substrate are removed by means of the patterned hard mask so as to form the trenches in the substrate, and the un-removed substrate corresponds to the MOS regions. In one specific embodiment, the nitride 110 and oxide 105 are patterned, and parts of the semiconductor substrate 100 are removed to form trenches 120 and MOS regions 115a and 115b surrounded by the trenches, wherein, there is also a trench between the MOS regions 115a and 115b. FIG. 1a is a top view of the resulting structure, FIG. 1b is a planar view taken along line AA' in FIG. 1a. Two MOS regions are shown in the figure, but this is only an example and more than two MOS regions can be formed on the substrate. The methods for patterning and removing include, but are not limited to, dry etching and wet etching, and Reactive Ion Etching (RIE) is preferable.

The method for forming trenches includes, but is not limited to, the above-mentioned method. In another embodiment, the trenches can be formed by directly cutting the substrate using a cutting technology. More generally, the trenches can be formed by any appropriate method in the art.

Then, a step of filling the trenches with a dielectric material having a stress is performed, and the dielectric material having a stress may include, but not limited to, strained nitride.

Figure 3A:
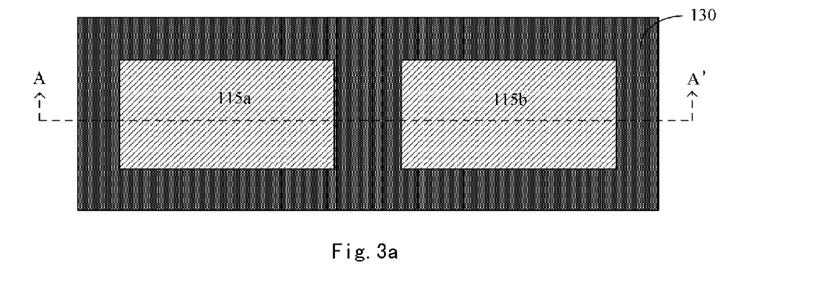
Figure 3B:
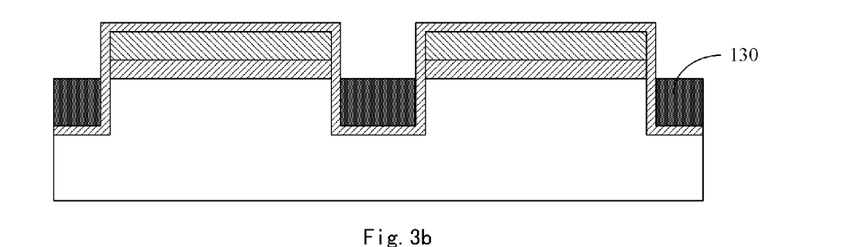

To this end, in one specific embodiment, a strained nitride 130 is formed in the trenches 120 to fill the trenches, as shown in FIG. 3. FIG. 3a is a top view of the resulting structure, and FIG. 3b is a planar view taken along line AA' in FIG. 3a. It can be seen from FIG. 3a that the MOS regions are completely surrounded by the strained nitride 130. In the case where the MOS to be made is an nMOS, the nitride should have a tensile stress, while in the case where the MOS to be made is a pMOS, the nitride should have a compressive stress. Specifically, the structure can be formed by depositing the strained nitride 130 and by etching back or Chemical Mechanical Polishing (CMP) the nitride.

In the specific embodiment where the trenches are formed by directly cutting the substrate, the structure can be formed by depositing the strained nitride 130 and by etching back or CMP the nitride to expose the substrate in the MOS regions.

Figure 2:
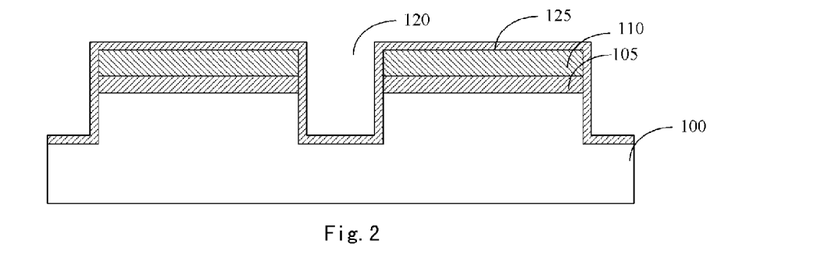

Preferably, before filling the strained nitride, a layer of oxide 125 is formed in the trenches. The method of forming the oxide includes, but is not limited to, Chemical Vapor Deposition (CVD), Plasma Assisted CVD, Atomic Layer Deposition (ALD), vapor deposition, reactive sputtering, chemical solution deposition or other similar deposition techniques. The oxide functions as a buffer layer between the strained nitride and the substrate. In the specific embodiment using the hard mark, the oxide 125 also exists on the MOS regions, as shown in FIG. 2. In the specific embodiment where the trenches are formed by directly cutting the substrate, the oxide 125 does not exist on the surface of the exposed substrate in the MOS regions.

Next, a step of removing a part of the strained nitride in the trenches is performed.

To this end, at least the strained nitride 130 in the trenches which is adjacent to the position (the area surrounded by dashed lines in FIG. 4a) where a channel is to be formed on each of the MOS regions (115a, 115b), is removed, and the portions where the strained nitride are removed respectively form exposed regions 1251, 1252, 1253 and 1254. In the channel length direction, the boundary of each exposed region is substantially aligned with the boundary of the position where a channel is to be formed. The word "substantially" herein means that the boundary of the exposed region is aligned with the boundary of the position where a channel is to be formed within the range of process tolerance. FIGS. 4c and 4d are sectional views taken along lines AA' and BB' in FIG. 4a. Positions C, S and D in the figures correspond to the channel to be formed, the source to be formed and the drain to be formed, respectively. In another embodiment, any one of the boundaries of exposed regions 1251, 1252, 1253 and 1254 can extend along the direction of the length of the channel to be formed (the direction indicated by the double-headed arrow line in FIG. 4b) until it is aligned with the boundary of the corresponding MOS region. The method of removing the strained nitride includes, but is not limited to, RIE selective to the materials thereunder.

In the case where the MOS device is an nMOS device, after removing the tensile strained nitride in the trenches corresponding to the position where a channel is to be formed in each of the MOS regions, owing to the corner effect, the tensile stress of the tensile strained nitride 130 at the periphery of each of the MOS regions is more concentrating in the channel, thereby generating a larger stress. In the case where the MOS device is a pMOS device, after removing the compressive strained nitride in the trenches corresponding to the position where a channel is to be formed in each of the MOS regions, owing to the corner effect, the compressive stress of the compressive strained nitride 130 at the periphery of each of the MOS regions is more concentrating in the channel, thereby generating a larger stress. As for detailed explanations of the "corner effect" mentioned herein, reference can be made to relevant technical documents that have been published, and it is known to those skilled in the art.

Figure 4A:
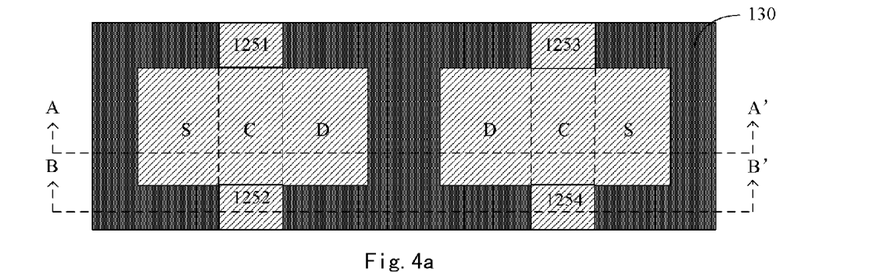
Figure 4B:
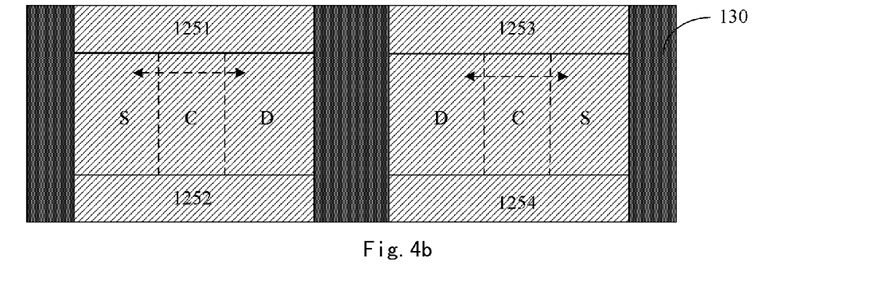
Figure 4C:
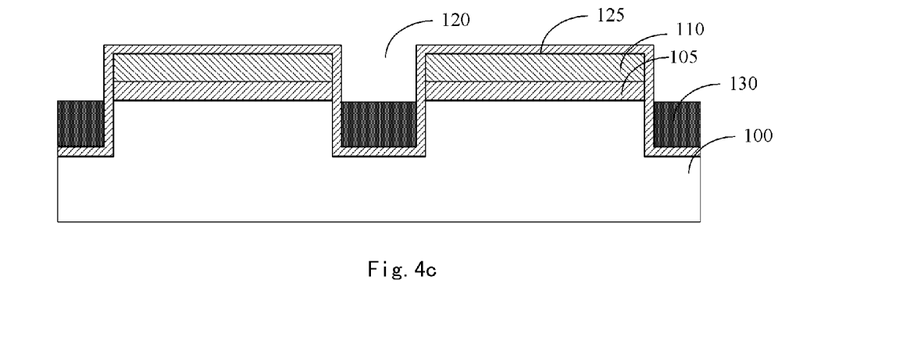
Figure 4D:
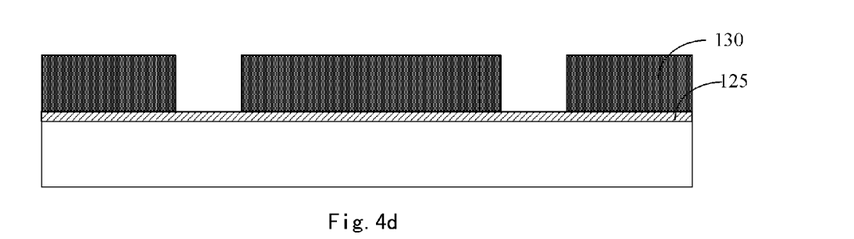

The following describes the case shown in FIG. 4a.

Figure 5A:
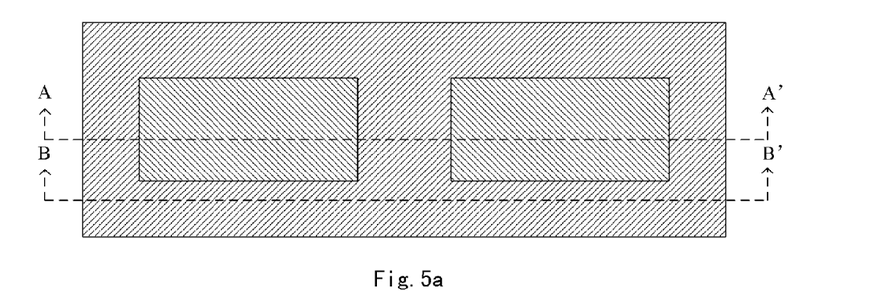
Figure 5B:
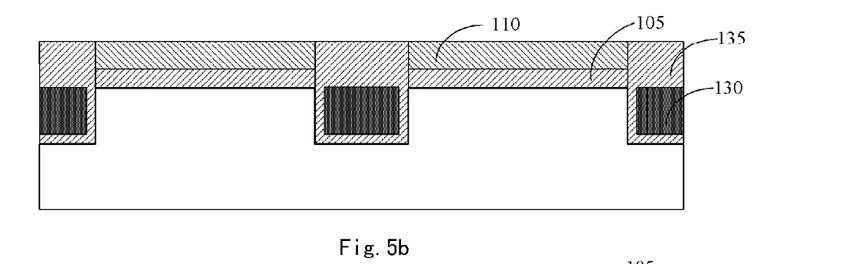
Figure 5C:
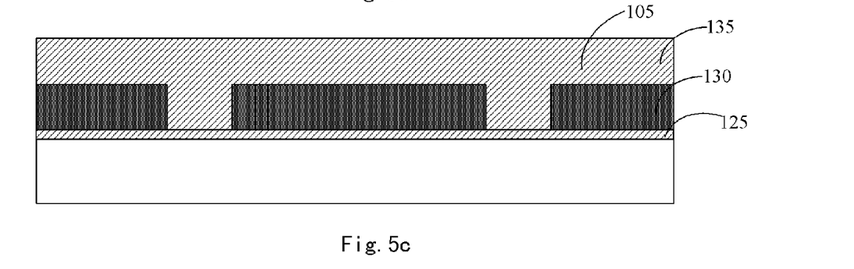

The exposed regions are filled with a dielectric material 135, such as an oxide. In the specific embodiment where the hard mask is used, the step is realized through depositing the dielectric material 135 and planarizing it by etching back or a CMP technology until exposing the hard mask on the MOS regions, as shown in FIG. 5. Wherein, FIG. 5a is a top view after the step, and FIGS. 5b and 5c are sectional views taken along the lines AA' and BB' in FIG. 5a. In the specific embodiment where the trenches are formed by directly cutting the substrate, the structure can be formed through depositing the dielectric material 135 and etching back or CMP the dielectric material 135 to expose the substrate in the MOS regions.

Figure 6A:
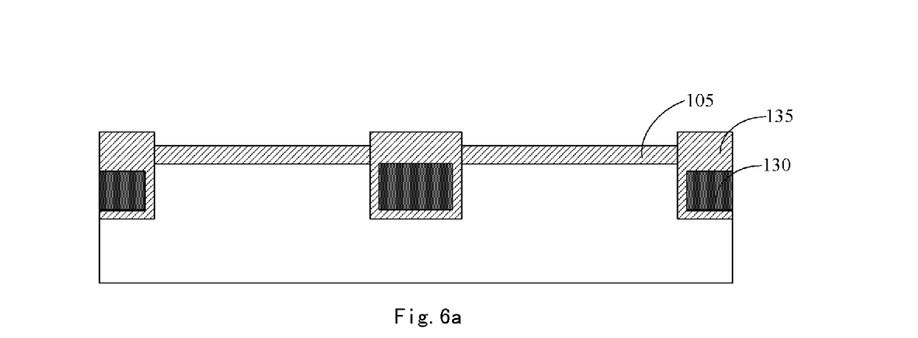
Figure 6B:
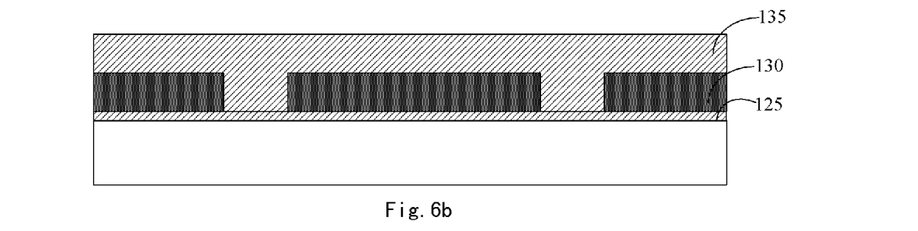

In the specific embodiment where the hard mask is used, there is a further step of removing the nitride 110, as shown in FIGS. 6a and 6b. Wherein, FIGS. 6a and 6b are sectional views taken along lines AA' and BB', respectively. The method of removing the nitride 110 includes but is not limited to RIE selective to the dielectric material 135. In this step, the strained nitride 130 is covered by the dielectric material 135 and thus is not influenced. Subsequently, the oxide 105 on the MOS regions is removed to expose the substrate 100 thereon. Meanwhile, the dielectric material 135 of a certain thickness is also removed.

Figure 7A:
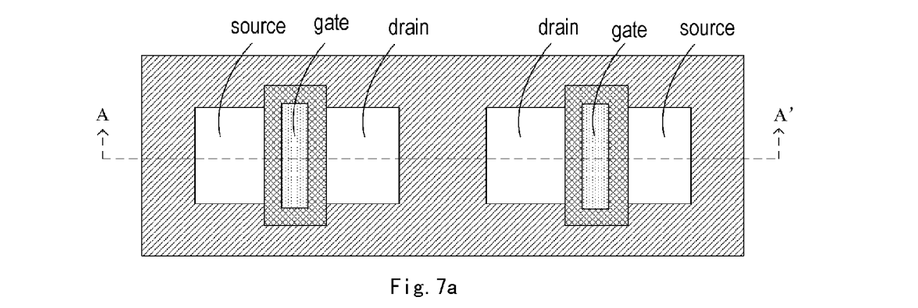
Figure 7B:
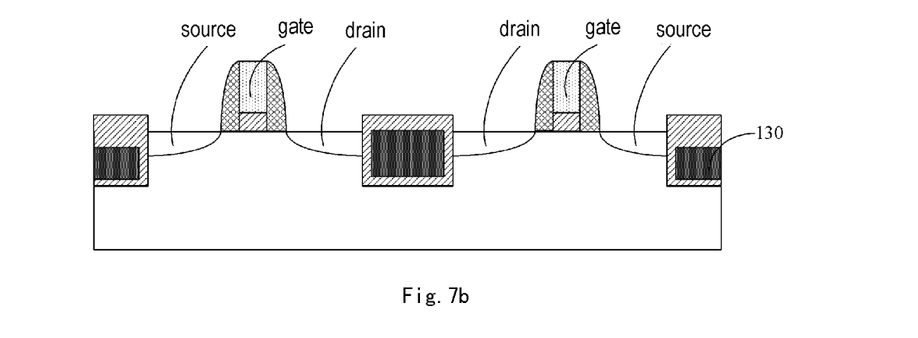

Next, a MOS device is formed using a conventional MOS technology, wherein a channel is formed at a position (position C of FIG. 4) where a channel is to be formed, a gate is formed above the channel, and a source and a drain are formed at both sides of the channel (positions S and D of FIG. 4), as shown in FIG. 7. FIG. 7a is a top view after the step, and FIG. 7b is a sectional view taken along line AA' in FIG. 7a.

Second Embodiment

The second embodiment is substantively the same as the first embodiment, and descriptions below focus on the differences, while the parts that are the same as the first embodiment will not be elaborated any more.

A similar substrate as that in the first embodiment is provided.

Figure 8A:
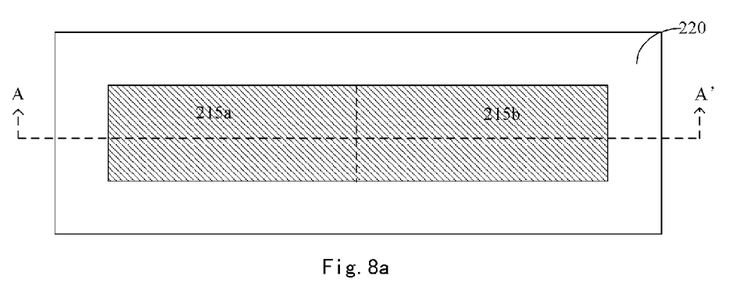
Figure 8B:
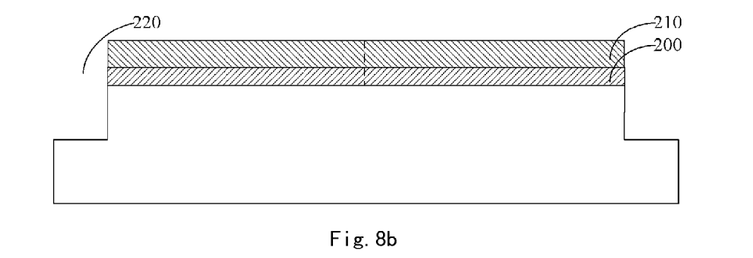

MOS regions 215a and 215b and trenches 220 surrounding MOS regions 215a and 215b are formed, unlike in the first embodiment, the MOS regions 215a and 215b are directly adjacent to each other without any trench therebetween. FIG. 8a is a top view of the resulting structure, and FIG. 8b is a planar view taken along line AA' in FIG. 1a.

Figure 9:
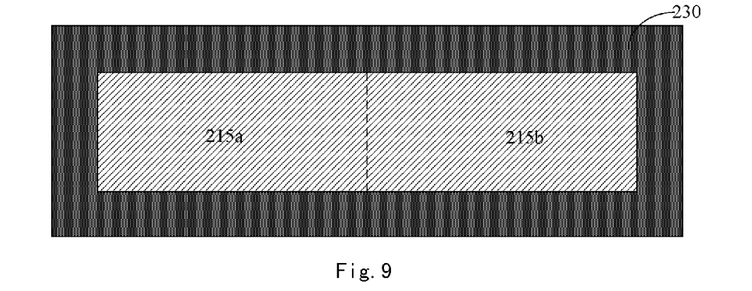

Then a step similar to that in the first embodiment is performed to form a dielectric material having a stress in the trenches 220 to fill the trenches, and the dielectric material includes, but not limited to, a strained nitride 230, as shown in FIG. 9.

At least the strained nitride 230 in the trenches, which is adjacent to the position (the area surrounded by dashed lines in FIG. 10a) where a channel is to be formed on each of the MOS regions (215a, 215b), is removed, and the portions having the strained nitride removed respectively form exposed regions 2251, 2252, 2253 and 2254. In the channel length direction, the boundary of each exposed region is substantially aligned with the boundary of the position where a channel is to be formed. The word "substantially" herein means that the boundary of the exposed region is aligned with the boundary of the position where a channel is to be formed within the range of process tolerance. Positions C, S and D in the figures correspond to the channel to be formed, the source to be formed and the drain to be formed, respectively. In another embodiment, any one of the boundaries of exposed regions 2251, 2252, 2253 and 2254 can extend along the direction of the length of the channel to be formed (the direction indicated by the double-headed arrow line in FIG. 10b) until it is aligned with the boundary of the corresponding MOS region. The method of removing the strained nitride includes, but is not limited to, RIE selective to the materials thereunder.

In the case where the MOS device is an nMOS device, after removing the tensile strained nitride in the trenches corresponding to the position where a channel is to be formed in each of the MOS regions, owing to the corner effect, the tensile stress of the tensile strained nitride 230 at the periphery of each of the MOS regions is more concentrating in the channel, thereby generating a larger stress. In the case where the MOS device is a pMOS device, after removing the compressive strained nitride in the trenches corresponding to the position where a channel is to be formed in each of the MOS regions, owing to the corner effect, the compressive stress of the compressive strained nitride 230 at the periphery of each of the MOS regions is more concentrating in the channel, thereby generating a larger stress.

Figure 10A:
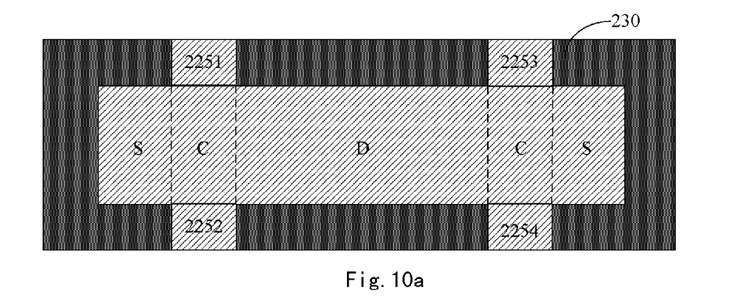
Figure 10B:
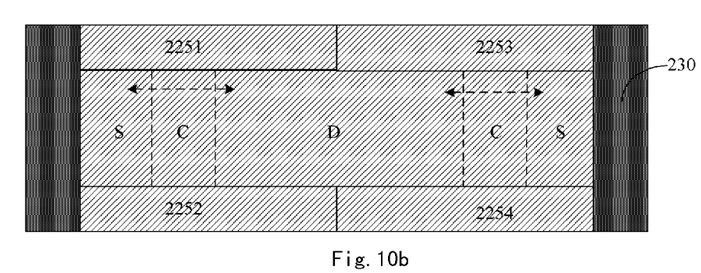
Figure 11A:
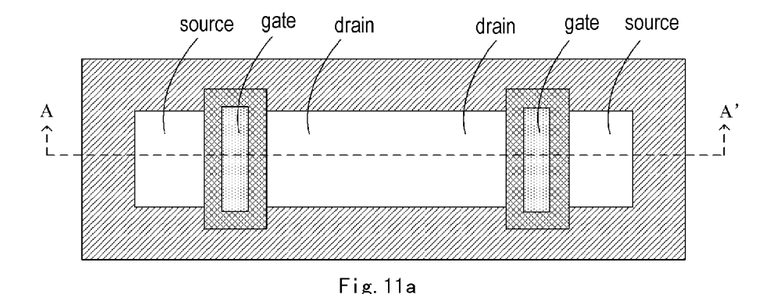
Figure 11B:
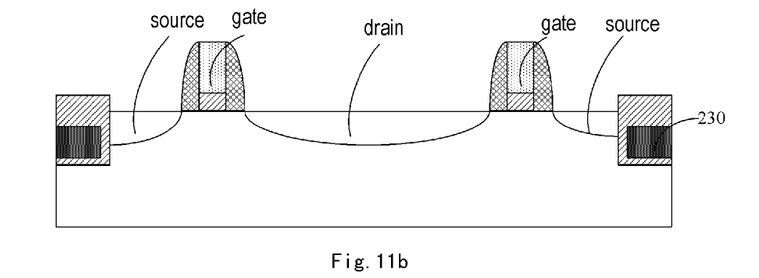

Taking the case shown in FIG. 10 as an example, a step similar to that of the first embodiment proceeds to form a MOS device, wherein a channel is formed at a position (position C in FIG. 10) where a channel is to be formed, a gate is formed above the channel, and a source and a drain are formed at both sides of the channel (positions S and D in FIG. 10), as shown in FIG. 11. FIG. 11a is a top view after the step, and FIG. 11b is a sectional view taken along line AA' in FIG. 11a.

Third Embodiment

First, a semiconductor substrate 300 is provided, and it can be of any type known in the field of electronics, such as a bulk semiconductor, and Semiconductor On Insulator (SOI). The material of the substrate can be monocrystalline silicon, gallium arsenide, indium phosphide, etc. In one specific embodiment, the semiconductor substrate 300 is a silicon substrate with (100) crystal orientation or (110) crystal orientation. The selection of the crystal orientation depends on requirements for the performance of the finished device, and the substrate with (100) crystal orientation can help to increase mobility of electrons in the device, while the substrate with (110) crystal orientation can help to increase mobility of holes in the device, and the electron mobility is greater than the hole mobility due to their properties. Therefore, in a CMOS device, for example, if it is desired that the performance of the pMOS device therein is as close as possible to the performance of the nMOS device, then the substrate with (110) crystal orientation is preferable; and if a higher performance of the nMOS device is desired, then the substrate with (100) crystal orientation is preferable. In addition, the provided semiconductor substrate may be P-type, N-type or un-doped.

Next, the step of forming trenches and MOS regions surrounded by the trenches on the semiconductor substrate is performed.

To this end, a hard mask is first formed in an embodiment. In one specific embodiment, an oxide 305 is first formed on the semiconductor substrate 300, and it includes, but is not limited to, $SiO_2$, and has a thickness within the range of about 5-20 nm, for example. The method of forming the oxide includes, but is not limited to, Chemical Vapor Deposition (CVD), Plasma Assisted CVD, Atomic Layer Deposition (ALD), vapor deposition, reactive sputtering, chemical solution deposition or other similar deposition techniques. As a substitute, the oxide may also be formed by a thermal oxidation technology or by a combination of thermal oxidation technology and deposition technology. For example, in the case where the substrate is formed of Si, thermal oxidation is performed on the silicon substrate to form a thin $SiO_2$, and then the rest $SiO_2$ is deposited to reach a predetermined height using a deposition technology.

Next, a nitride 310 is formed on the oxide 305. The nitride includes, but is not limited to, SiN and $Si_3N_4$, and the thickness thereof is, for example, within a range of about 50-150 nm. The method of forming the nitride includes, but is not limited to, Chemical Vapor Deposition (CVD), Plasma Assisted CVD, Atomic Layer Deposition (ALD), vapor deposition, reactive sputtering, chemical solution deposition or other similar deposition techniques.

Figure 12A:
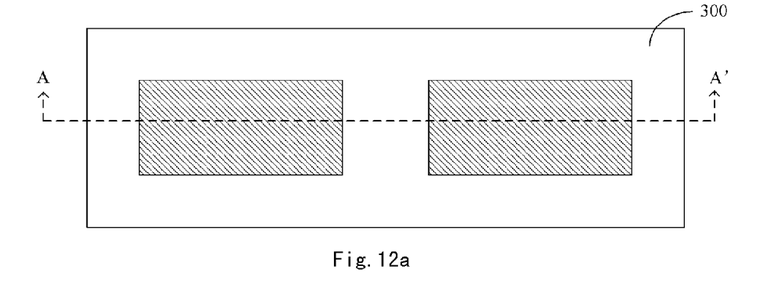
Figure 12B:
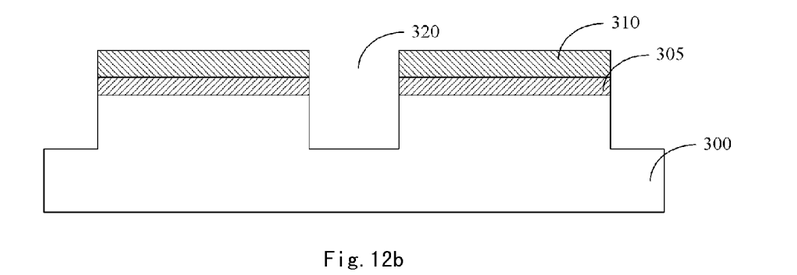

Then, the oxide and nitride are patterned to form a patterned hard mask, and parts of the substrate are removed by means of the patterned hard mask so as to form trenches in the substrate, and the un-removed substrate corresponds to the MOS regions. In one specific embodiment, the nitride 310 and oxide 305 are patterned, and parts of the semiconductor substrate 300 are removed to form trenches 320 and MOS regions 315a and 315b surrounded by the trenches. There is also a trench between the MOS regions 315a and 315b. FIG. 12a is a top view of the resulting structure, and FIG. 12b is a planar view taken along line AA' in FIG. 12a. Two MOS regions are shown in the figure, but this is only an example and more than two MOS regions can be formed on the substrate. The methods for patterning and removing include, but are not limited to, dry etching and wet etching, and Reactive Ion Etching (RIE) is preferable.

The method for forming trenches includes, but is not limited to, the above-mentioned method. In yet another embodiment, the trenches can be formed by directly cutting the substrate using a cutting technology. More generally, the trenches can be formed by any appropriate method in the art.

Then, a step of filling the trenches with a dielectric material having a stress is performed, the dielectric material having a stress including, but not limited to, strained nitride.

Figure 14A:
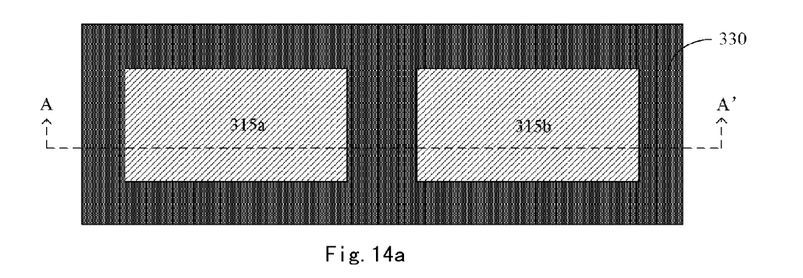
Figure 14B:
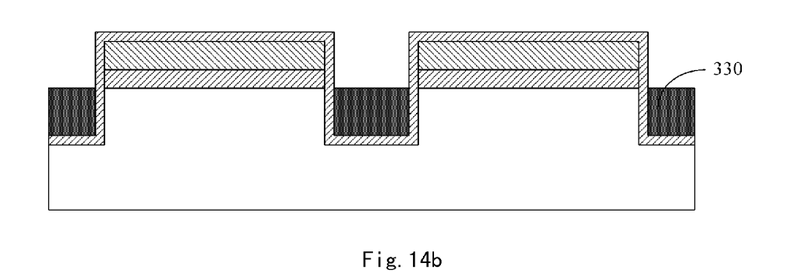

To this end, in one specific embodiment, a strained nitride 330 is formed in a trenches 320 to fill the trenches, as shown in FIG. 14. FIG. 14a is a top view of the resulting structure, and FIG. 14b is a planar view taken along line AA' in FIG. 14a. It can be seen from FIG. 14a that the MOS regions are completely surrounded by the strained nitride 330. In the case where the MOS to be made is an nMOS, the nitride should have a compressive stress, while in the case where the MOS to be made is a pMOS, the nitride should have a tensile stress. Specifically, the structure can be formed by depositing the strained nitride 330 and by etching back or Chemical Mechanical Polishing (CMP) the nitride. In one specific embodiment, the structure can be formed by depositing the strained nitride 330 and by etching back or Chemical Mechanical Polishing (CMP) the nitride.

In the specific embodiment where the trenches are formed by directly cutting the substrate, the structure can be formed by depositing the strained nitride 330 and by etching back or CMP the nitride to expose the substrate in the MOS regions.

Figure 13:
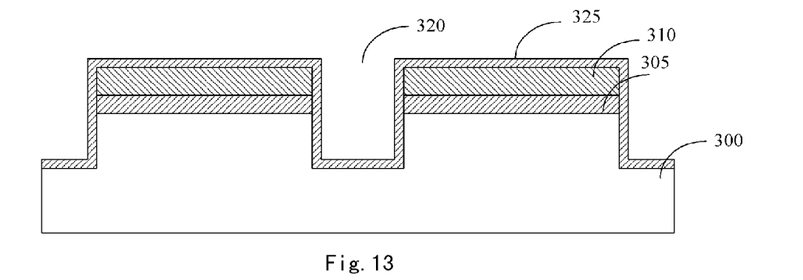

Preferably, before filling the strained nitride, a layer of oxide 325 is formed in the trenches. The method of forming the oxide includes, but is not limited to, Chemical Vapor Deposition (CVD), Plasma Assisted CVD, Atomic Layer Deposition (ALD), vapor deposition, reactive sputtering, chemical solution deposition or other similar deposition techniques. The oxide functions as a buffer layer between the strained nitride and the substrate. In the specific embodiment where the hard mark is used, the oxide 325 also exists on the MOS regions, as shown in FIG. 13. In the specific embodiment where the trenches are formed by directly cutting the substrate, the oxide 325 does not exist on the surface of the exposed substrate in the MOS regions.

Next, a step of removing a part of the strained nitride in the trenches is performed.

To this end, at least the strained nitride 330 in the trenches at outer sides of the ends of the two MOS regions (315a, 315b) that are away from each other is removed, and the portions having the strained nitride removed respectively form exposed regions 3251 and 3252. In the channel length direction, the boundary of each exposed region is substantially aligned with the boundary of the corresponding MOS region. The word "substantially" herein means that the boundary of the exposed region is aligned with the boundary of the corresponding MOS region within the range of process tolerance. In another embodiment, any one of the exposed regions 3251 and 3252 can extend toward the direction of the channel to be formed along the direction of the length of the channel (the direction indicated by the double-headed arrow line in FIG. 15b) until reaching the boundary of the position where a channel is to be formed. Positions C, S and D in FIG. 15b respectively correspond to the channel to be formed, the source to be formed and the drain to be formed. FIGS. 15c and 15d are sectional views taken along lines AA' and BB' in FIG. 15b, respectively. The method of removing the strained nitride includes, but is not limited to, RIE selective to the materials thereunder.

In the case where the MOS device is an nMOS device, after removing the compressive strained nitride in the periphery, owing to the corner effect, the compressive stress of the remaining compressive strained nitride 330 is more concentrating in the channel, thereby generating a larger stress. In the case where the MOS device is a pMOS device, after removing the tensile strained nitride in the periphery, owing to the corner effect, the tensile stress of the remaining tensile strained nitride 330 is more concentrating in the channel, thereby generating a larger stress.

Figure 15A:
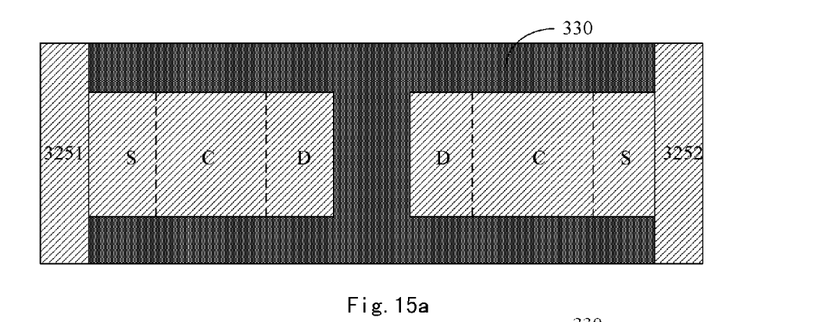
Figure 15B:
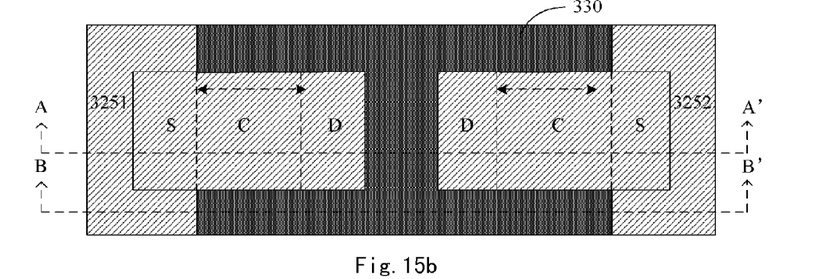
Figure 15C:
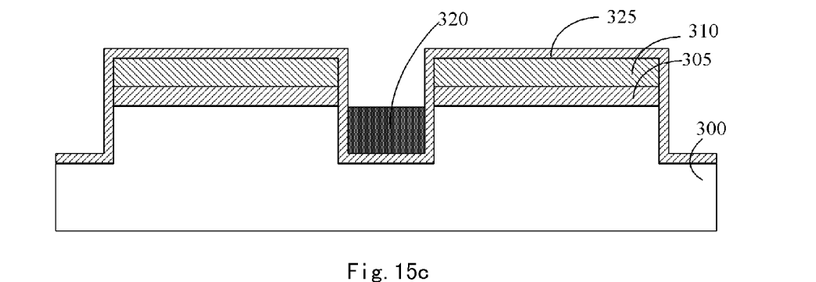
Figure 15D:
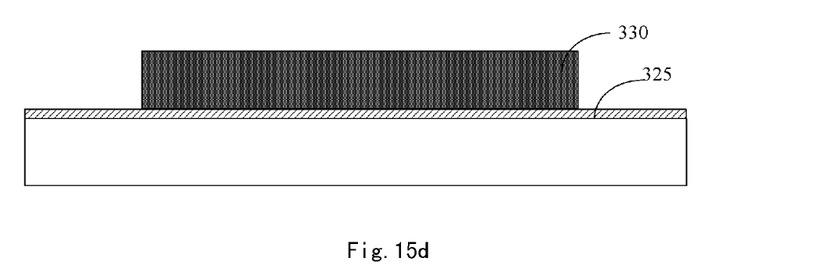

The following describes the case shown in FIG. 15b.

Figure 16A:
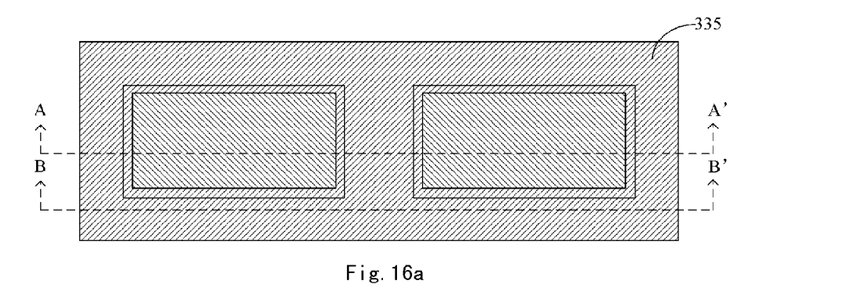
Figure 16B:
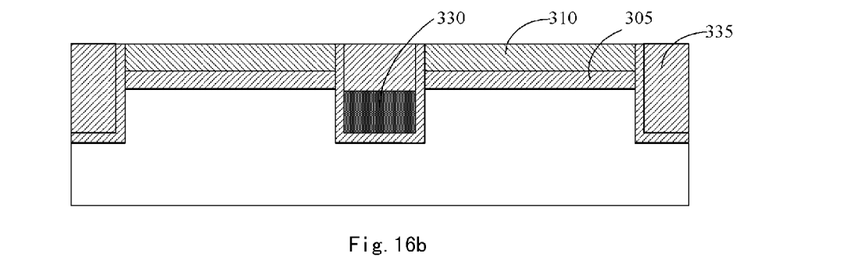
Figure 16C:
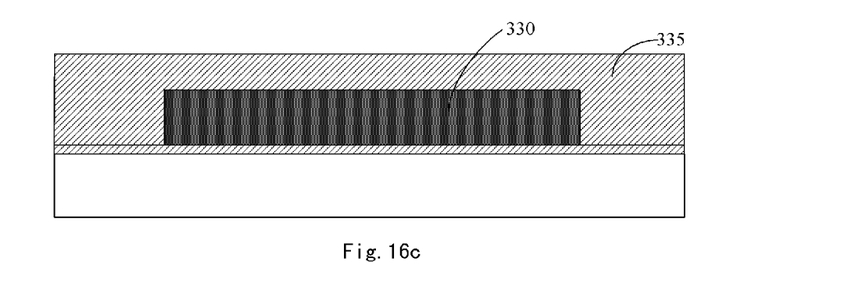

The exposed regions are filled with a insulating material 335, such as an oxide. In the specific embodiment where the hard mask is used, the step is realized through depositing the insulating material 335 and planarizing it by etching back or a CMP technology until exposing the hard mask on the MOS regions, as shown in FIG. 16. FIG. 16a is a top view after the step, and FIGS. 16b and 16c are sectional views taken along lines AA' and BB' in FIG. 16a. In the specific embodiment where the trenches are formed by directly cutting the substrate, the structure can be formed through depositing the insulating material 335 and etching back or CMP the insulating material 335 to expose the substrate in the MOS regions.

Figure 17A:
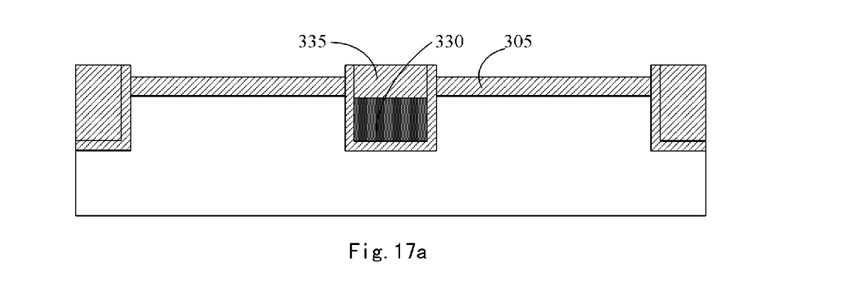
Figure 17B:
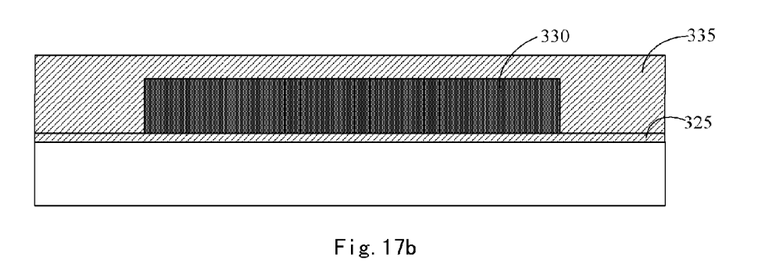

In the specific embodiment where the hard mask is used, there is a further step of removing the nitride 310, as shown in FIGS. 17a and 17b. Wherein, FIGS. 17a and 17b are sectional views taken along lines AA' and BB', respectively. The method of removing the nitride 310 includes but is not limited to RIE selective to the insulating material 335. In this step, the strained nitride 330 is covered by the insulating material 335 and thus is not influenced. Subsequently, the oxide 305 on the MOS regions is removed to expose the substrate 300 thereon. Meanwhile, the insulating material 335 of a certain thickness is also removed.

Figure 18A:
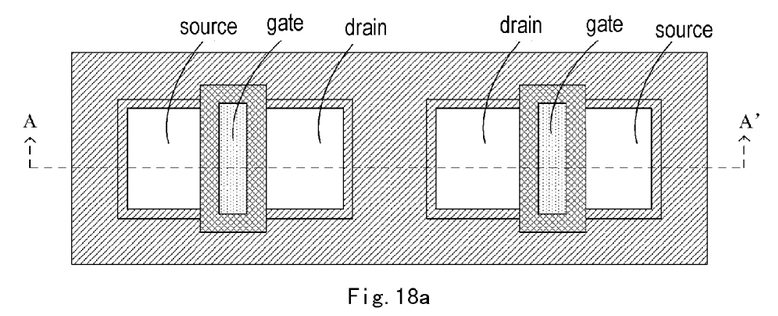
Figure 18B:
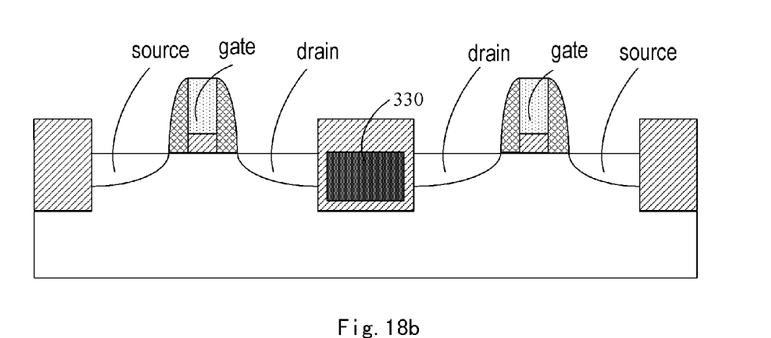

Next, a MOS device is formed using a conventional MOS technology, wherein a channel is formed at a position (position C of FIG. 15) where a channel is to be formed, a gate is formed above the channel, and a source and a drain are formed at both sides of the channel (positions S and D of FIG. 15), as shown in FIG. 18. FIG. 18a is a top view after the step and FIG. 18b is a sectional view taken along line AA' in FIG. 18a.

Fourth Embodiment

The fourth embodiment is substantively the same as the third embodiment, so descriptions below focus on the differences, while the parts that are the same as the third embodiment will not be elaborated any more.

A similar substrate as that in the third embodiment is provided.

Two MOS regions and trenches surrounding the MOS regions are formed, unlike in the third embodiment, the two MOS regions are directly adjacent to each other without any trench therebetween, which is similar to the case shown in FIG. 8.

Then a step similar to that in the first embodiment is performed to form a dielectric material having a stress in the trenches to fill the trenches, the dielectric material including, but not limited to, a strained nitride, which is similar to the case shown in FIG. 9.

Figure 19A:
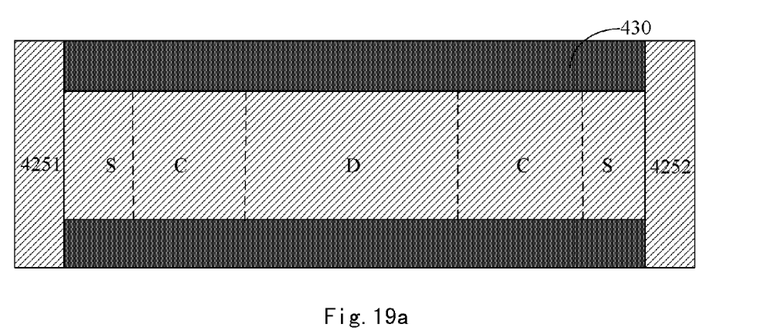
Figure 19B:
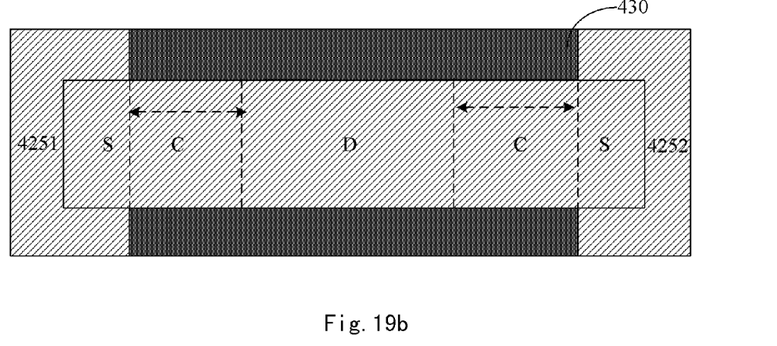

At least the strained nitride in the trenches at outer sides of the ends of the two MOS regions that are away from each other is removed, and the portions having the strained nitride removed respectively form exposed regions 4251 and 4252. In the channel length direction, the boundary of each exposed region is substantially aligned with the boundary of the corresponding MOS region. The word "substantially" herein means that the boundary of the exposed region is aligned with the boundary of the corresponding MOS region within the range of process tolerance. In another embodiment, any one of the exposed regions 4251 and 4252 can extend toward the direction of the channel to be formed along the direction of the length of the channel (the direction indicated by the double-headed arrow line in FIG. 19b) until reaching the boundary of the position where a channel is to be formed. Positions C, S and D in FIG. 19b correspond to the channel to be formed, the source to be formed and the drain to be formed, respectively. The method of removing the strained nitride includes, but is not limited to, RIE selective to the materials thereunder.

In the case where the MOS device is an nMOS device, after removing the compressive strained nitride in the periphery, owing to the corner effect, the compressive stress of the remaining compressive strained nitride 430 is more concentrating in the channel, thereby generating a larger stress. In the case where the MOS device is a pMOS device, after removing the tensile strained nitride in the periphery, owing to the corner effect, the tensile stress of the remaining tensile strained nitride 430 is more concentrating in the channel, thereby generating a larger stress.

Then, a MOS device is formed, wherein a channel is formed at the position where a channel is to be formed, a gate is formed above the channel and a source and a drain are formed at both sides of the channel.

The above described four embodiments are merely preferred embodiments of the present invention, and do not intend to limit the present invention. Therefore, various modifications and variations can be made to the present invention without departing from the principle of the technical method of the present invention and the protection scope of the attached claims.

What is claimed is:

1. A method for manufacturing a MOS device, comprising:
providing a semiconductor substrate;
forming trenches on the semiconductor substrate and at least a pMOS region and at least an nMOS region surrounded by the trenches;
filling the trenches with an oxide;
filling the trenches with a dielectric material having a stress;
removing at least the dielectric material having a stress and the oxide in the trenches which is adjacent to a position where a channel is to be formed on each of the pMOS and nMOS regions so as to form exposed regions;
filling the exposed regions with a insulating material; and
forming pMOS and nMOS devices on the pMOS region and the nMOS region, respectively, wherein each of the pMOS and nMOS devices comprises a channel, a gate formed above the channel, and a source and a drain formed at both sides of the channel;
wherein in a channel length direction, the boundary of each exposed region is substantially aligned with the boundary of the position of the channel, or the boundary of each exposed region extends along the channel length direction to be aligned with the boundary of corresponding pMOS or nMOS region; and
wherein the oxide is used as a buffer layer between the dielectric material and semiconductor substrate.

2. The method according to claim 1, wherein neighboring pMOS and nMOS regions are formed in such a way that they are directly adjacent to each other without any trench therebetween.

3. The method according to claim 1, wherein in the nMOS device, the dielectric material having a stress is a strained nitride having a tensile stress.

4. The method according to claim 1, wherein in the pMOS device, the dielectric material having a stress is a strained nitride having a compressive stress.

5. The method according to claim 1, wherein the step of forming the trenches further comprises:
forming a first oxide and a first nitride sequentially on the semiconductor substrate; and
patterning the first oxide and first nitride to form a patterned hard mask, and removing parts of the substrate by means of the patterned hard mask so as to form the trenches in the substrate.

6. The method according to claim 1, wherein the step of forming the trenches further comprises:
forming the trenches by directly cutting the substrate using a cutting technology.

7. The method according to claim 1, further comprises a step of forming a second oxide in the trenches before the step of filling the dielectric material having a stress.

8. The method according to claim 5, further comprises a step of removing the hard mask after the step of filling the insulating material.

9. A method of manufacturing a MOS device, comprising:
providing a semiconductor substrate;
forming trenches on the semiconductor substrate, at least a pMOS region and at least an nMOS region surrounded by the trenches;
filling the trenches with an oxide;
filling the trenches with a dielectric material having a stress;
removing at least the dielectric material having a stress and the oxide in the trenches at outer sides of the pMOS and nMOS regions that are away from each other, so as to form exposed regions at portions where the dielectric material having a stress are removed;
filling the exposed regions with a insulating material; and
forming pMOS and nMOS devices on the pMOS and nMOS regions, respectively, wherein each of the pMOS and nMOS devices comprises a channel, a gate formed above the channel, and a source and a drain formed at both sides of the channel;
wherein in channel length direction, boundary of each exposed region is substantially aligned with boundary of corresponding pMOS or nMOS region, or the boundary of each exposed region extends toward the direction of the channel along the channel length direction until it reaches the boundary of the position where a channel is formed; and
wherein the oxide is used as a buffer layer between the dielectric material and semiconductor substrate.

10. The method according to claim 9, wherein neighboring pMOS and nMOS regions are formed to be directly adjacent to each other without any trench therebetween.

11. The method according to claim 9, wherein in the nMOS device, the dielectric material having a stress is a strained nitride having a compressive stress.

12. The method according to claim 9, wherein in the pMOS device, the dielectric material having a stress is a strained nitride having a tensile stress.

13. The method according to claim 9, wherein the step of forming the trenches further comprises:
forming a first oxide and a first nitride sequentially on the semiconductor substrate; and
patterning the first oxide and first nitride to form a patterned hard mask, and removing parts of the substrate by means of the patterned hard mask so as to form the trenches in the substrate.

14. The method according to claim 9, wherein the step of forming the trenches further comprises:
forming the trenches by directly cutting the substrate using a cutting technology.

15. The method according to claim 9, further comprising a step of forming a second oxide in the trenches before the step of filling the dielectric material having a stress.

16. The method according to claim 13, further comprising a step of removing the hard mask after the step of filling the insulating material.

* * * * *